US 8,057,963 B2

(12) United States Patent
Eib et al.

(10) Patent No.: US 8,057,963 B2
(45) Date of Patent: Nov. 15, 2011

(54) MASKLESS VORTEX PHASE SHIFT OPTICAL DIRECT WRITE LITHOGRAPHY

(75) Inventors: Nicholas K. Eib, San Jose, CA (US); Ebo H. Croffie, Portland, OR (US); Neal P. Callan, Lake Oswego, OR (US)

(73) Assignee: LSI Corporation, Milpitas, CA (US)

(*) Notice: Subject to any disclaimer, the term of this patent is extended or adjusted under 35 U.S.C. 154(b) by 1701 days.

(21) Appl. No.: 11/011,896

(22) Filed: Dec. 14, 2004

(65) Prior Publication Data
US 2005/0275814 A1    Dec. 15, 2005

Related U.S. Application Data

(60) Provisional application No. 60/578,890, filed on Jun. 10, 2004.

(51) Int. Cl.
*G03F 1/00* (2006.01)
*G02B 26/00* (2006.01)
(52) U.S. Cl. ............ 430/5; 359/279; 359/290; 359/291; 359/295; 359/298
(58) Field of Classification Search .................. 359/290, 359/291, 295, 298, 279; 430/5
See application file for complete search history.

(56) References Cited

U.S. PATENT DOCUMENTS

| | | | |
|---|---|---|---|
| 6,504,644 B1 * | 1/2003 | Sandstrom | 359/291 |
| 6,811,933 B2 * | 11/2004 | Levenson | 430/5 |
| 7,189,498 B2 * | 3/2007 | Eib et al. | 430/322 |

OTHER PUBLICATIONS

Yashesh Shroff et al., "Optical Analysis of Mirror Based Pattern Generation", Proceedings of SPIE, vol. 5037 (2003), pp. 550-559.
U.S. Appl. No. 10/825,342, entitled: "Optimized Mirror Design for Optical Direct Write", by inventors Nicholas Eib et al., filed Apr. 14, 2004.
U.S. Appl. No. 10/988,087, entitled: "Process and Apparatus for Applying Apodization to Maskless Optical Direct Write Lithography Processes", by inventors Nicholas K. Eib et al., filed Nov. 12, 2004.
U.S. Appl. No. 10/993,603, entitled: "Process and Apparatus for Generating a Strong Phase Shift Optical Pattern for Use in an Optical Direct Write Lithography Process", by inventors Nicholas K. Eib et al., filed Nov. 19, 2004.
Marc D. Levenson et al., "The Vortex Mask: Making 80 nm Contacts with a Twist!", Proceedings of SPIE, vol. 4889 (2002), pp. 1293-1303.
Marc D. Levenson et al., "The Vortex Via Process: Analysis and Mask Fabrication for Contact CDs<80 nm", Proceedings of SPIE, vol. 5040 (2003), pp. 344-370.
Marc D. Levenson et al., "Vortex Via Validation", Proceedings of SPIE, vol. 5256 (2003), pp. 93-100.
Marc D. Levenson et al., "Advances in Vortex Via Fabrication", Proceedings of SPIE, vol. 5377 (2004), pp. 1237-1246.

* cited by examiner

*Primary Examiner* — Thorl Chea
(74) *Attorney, Agent, or Firm* — Otterstedt, Ellenbogen & Kammer, LLP

(57) ABSTRACT

The present invention provides methods and apparatus for accomplishing a optical direct write phase shift lithography. A lithography system and method are provided wherein a mirror array is configured to generate vortex phase shift optical patterns that are directed onto a photosensitive layer of a substrate. The lithography methods and systems facilitate pattern transfer using such vortex phase shift exposure patterns.

26 Claims, 5 Drawing Sheets

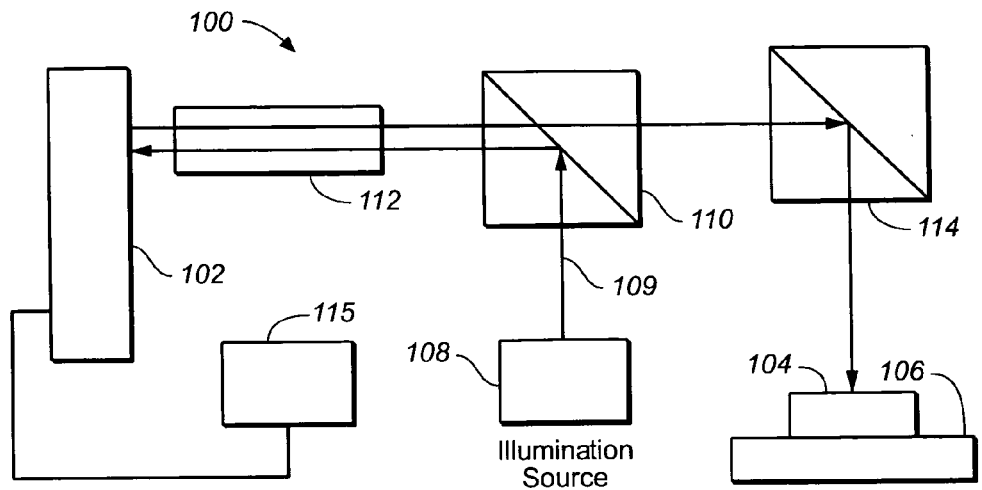
FIG._1
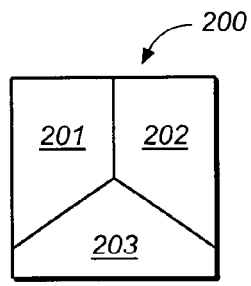
FIG._2A
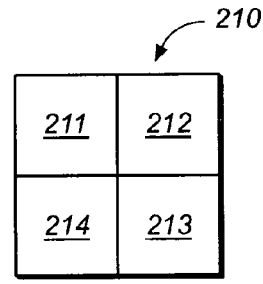
FIG._2B
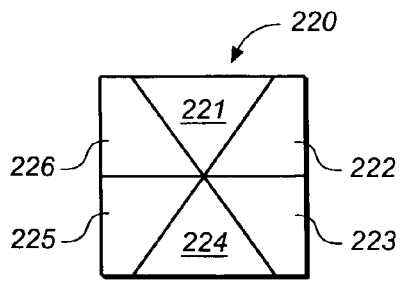
FIG._2C
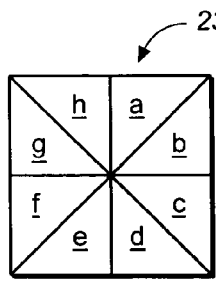
FIG._2D
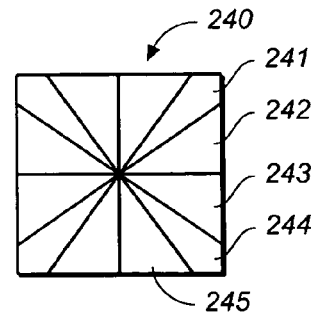
FIG._2E

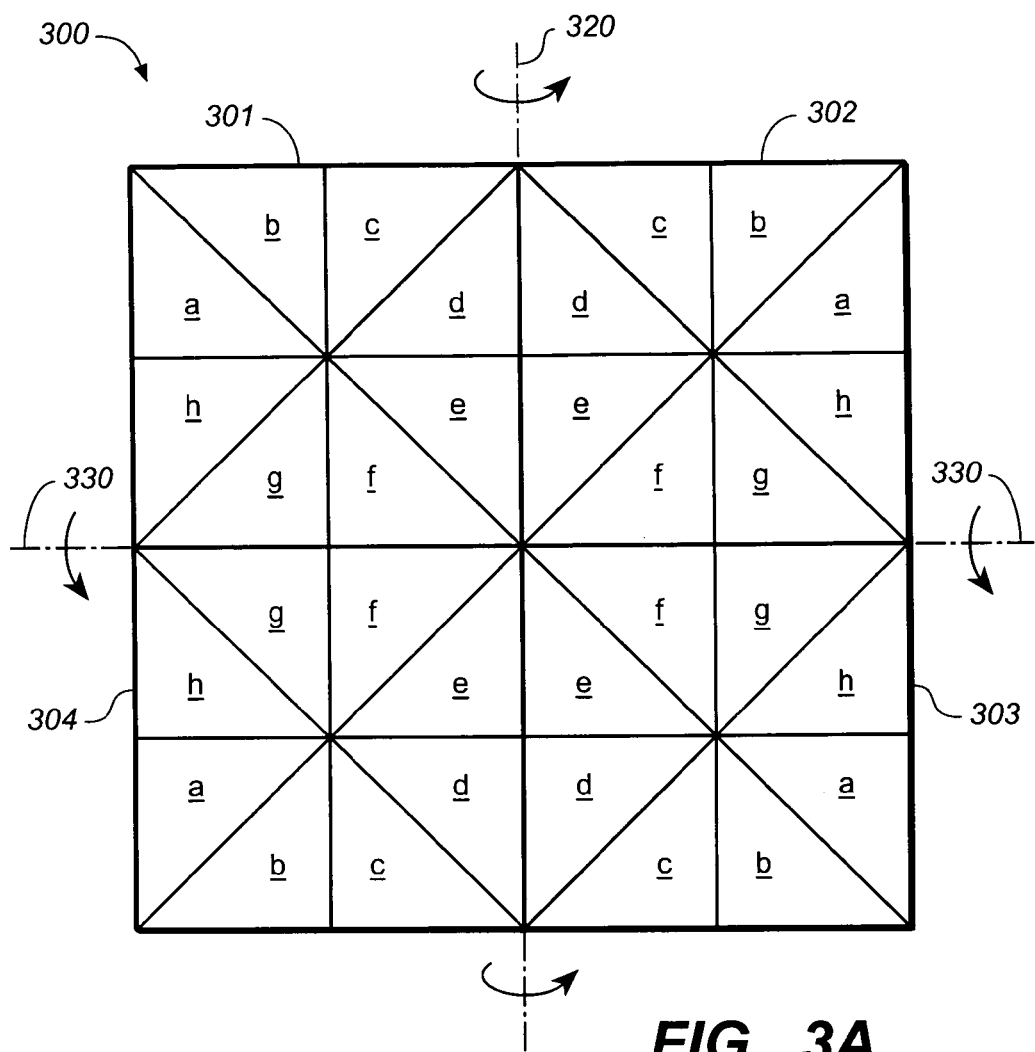
FIG._3A
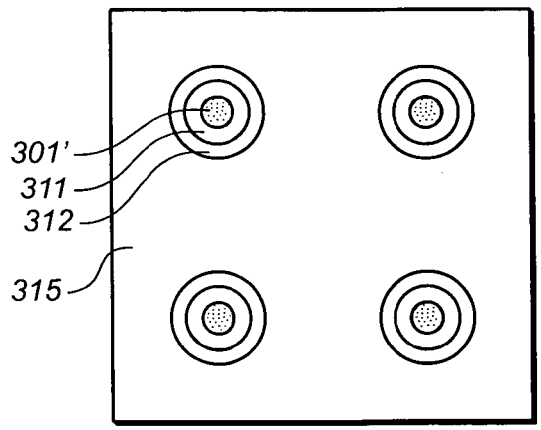
FIG._3B

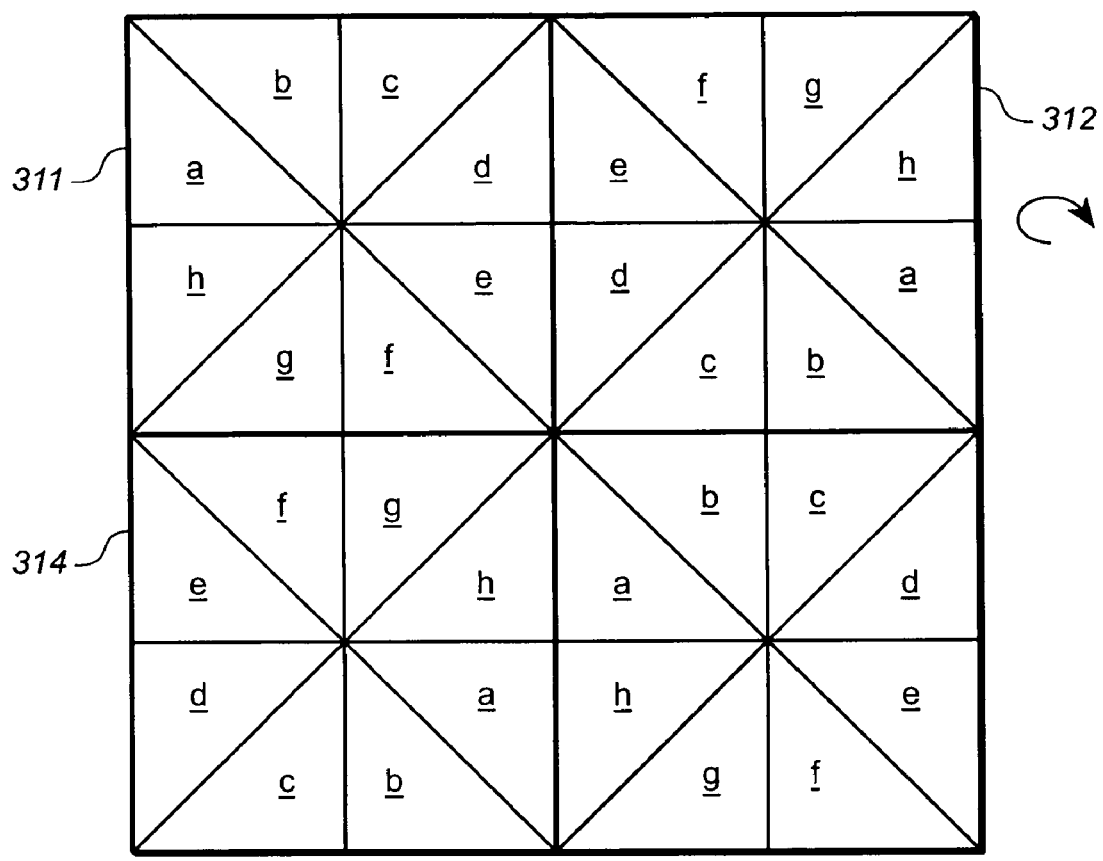
FIG._3C

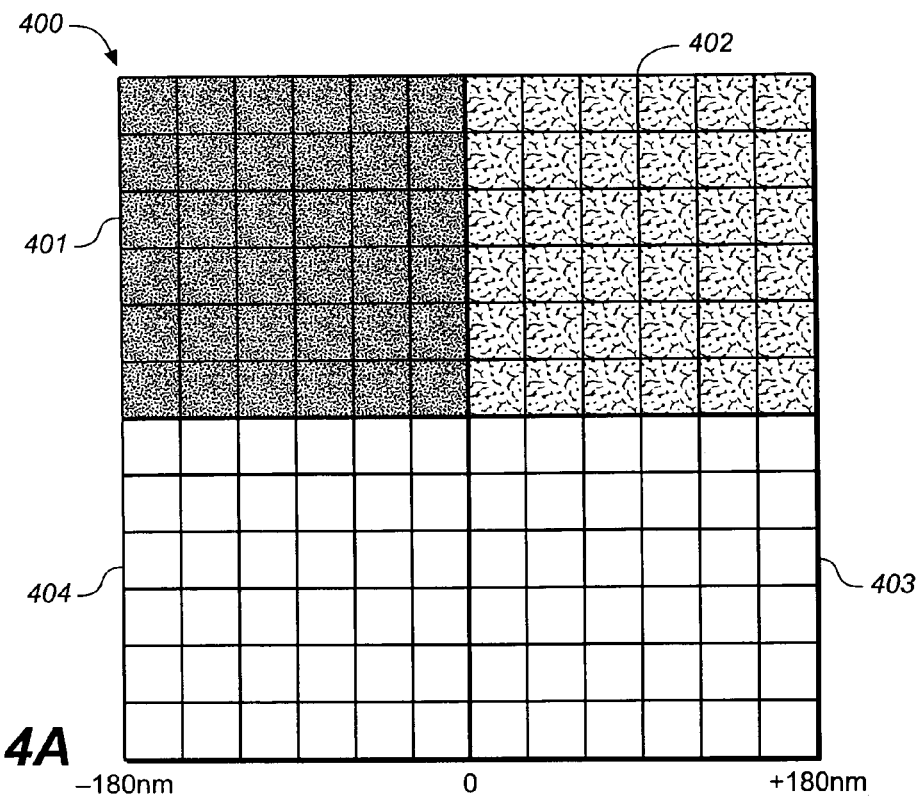
FIG._4A
−180nm　　　　　0　　　　　+180nm
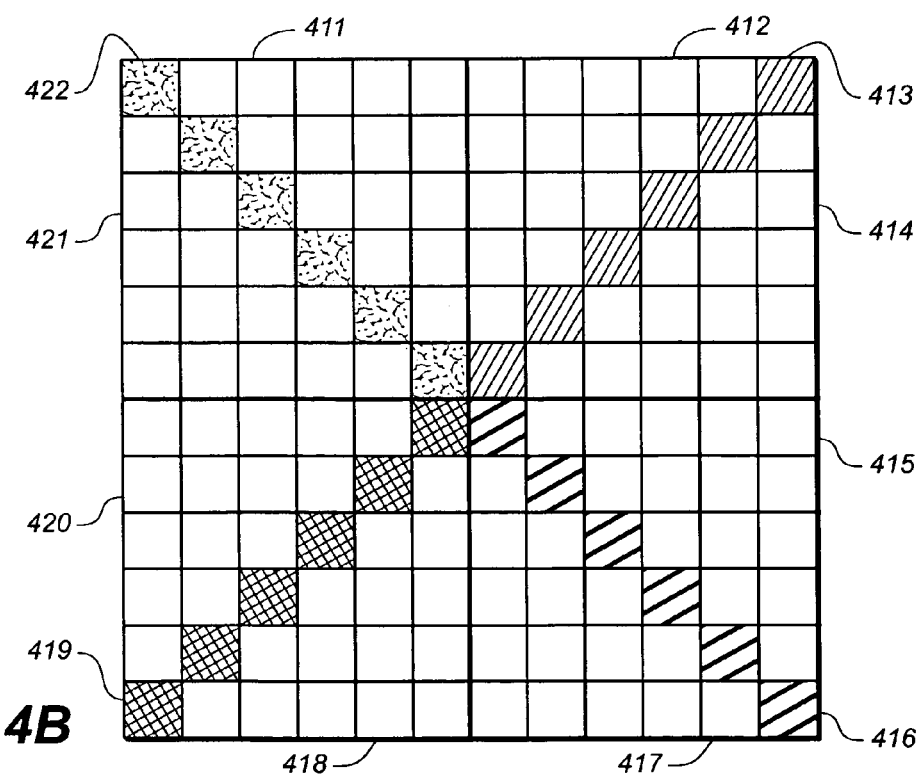
FIG._4B

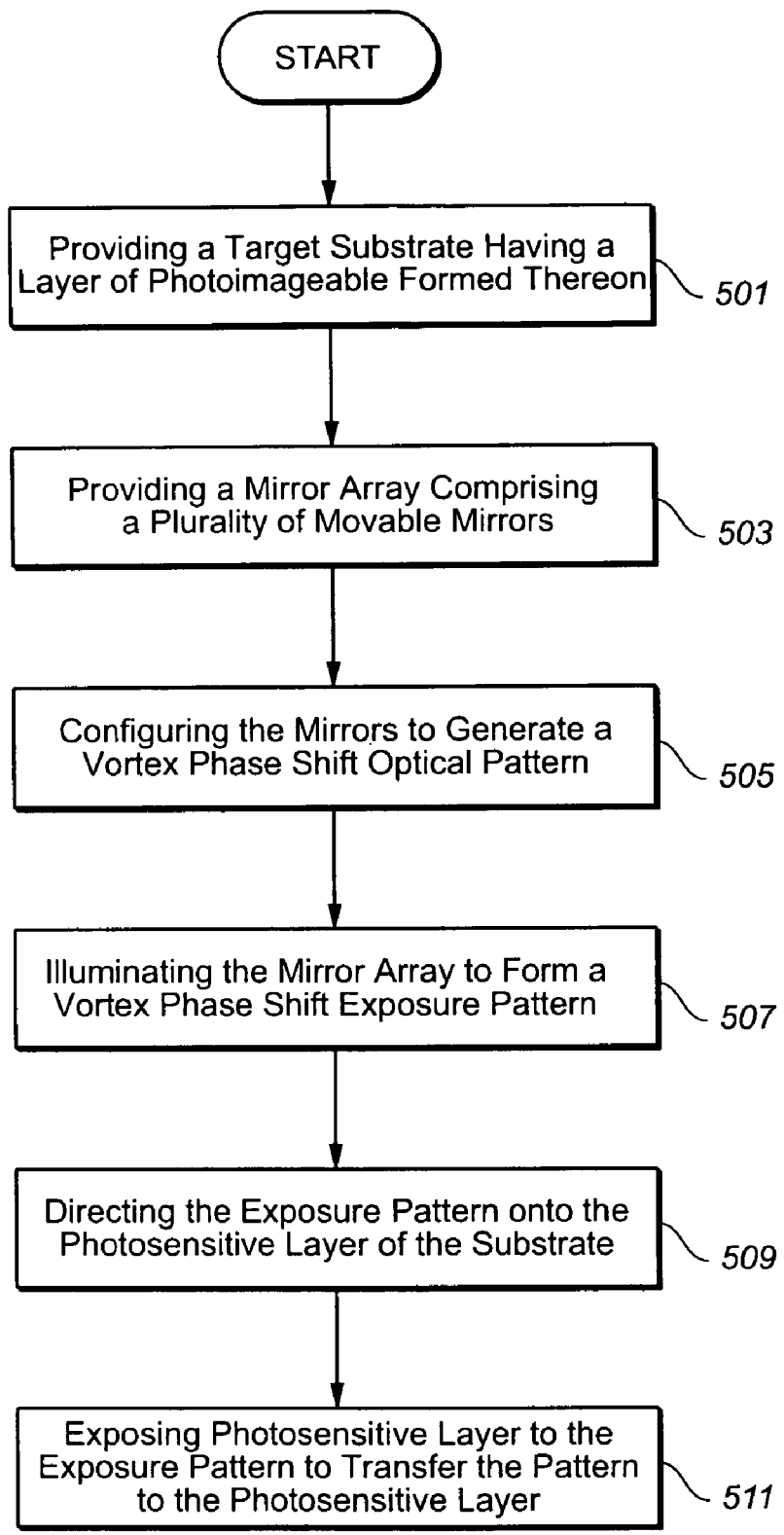
FIG._5

MASKLESS VORTEX PHASE SHIFT OPTICAL DIRECT WRITE LITHOGRAPHY

CROSS-REFERENCE TO RELATED APPLICATIONS

This application claims priority of U.S. Provisional Patent Application No. 60/578,890, filed Jun. 10, 2004, entitled: "Vortex Phase Shift Mask Applied to Optical Direct Write" which is incorporated herein by reference in its entirety for all purposes.

This application also is also related to the U.S. Utility patent application Ser. No. 10/825,342, filed 14 Apr. 2004, which application is incorporated herein by reference in its entirety for all purposes.

This application is also related to the U.S. Utility patent application Ser. No. 10/993,603, filed on 19 Nov. 2004, entitled: "Process And Apparatus For Generating A Strong Phase Shift Optical Pattern For Use In An Optical Direct Write Lithography Process" which application is incorporated herein by reference in its entirety for all purposes.

This application is also related to the U.S. Utility patent application Ser. No. 10/988,087, filed on 12 Nov. 2004, entitled: "Process And Apparatus For Applying Apodization to Maskless Optical Direct Write Lithography Process" which application is incorporated herein by reference in its entirety for all purposes.

FIELD OF THE INVENTION

The present invention relates to methods and apparatus for forming patterns on semiconductor wafers and other substrates. More particularly, the present invention relates to methods for using vortex phase shift patterns in optical direct write lithography to improve the quality of phase shift patterns formed on substrates and/or wafers, for example, to create semiconductor devices on the wafers.

BACKGROUND

Designers and semiconductor device manufacturers constantly strive to develop smaller devices from wafers, recognizing that circuits with smaller features generally produce greater speeds and increased packing density, therefore increased net die per wafer (numbers of usable chips produced from a standard semiconductor wafer). To meet these requirements, semiconductor manufacturers have been forced to build new fabrication lines at the next generation process node (gate length). As the critical dimensions for these devices grow smaller, greater difficulties will be experienced in patterning these features using conventional photolithography.

Conventional photolithography methods used for pattern generation involve exposing a light sensitive photoresist layer to a light source. The light from the source is modulated using a reticle, typically a chrome on quartz mask. The patterns formed on the reticle are transferred to the photoresist layer using typically visible or ultraviolet light. The areas so exposed are then developed (for positive photoresist) or, alternatively, the shaded areas are developed for negative type photoresist. The developed regions are then washed away and the remaining photoresist pattern used to provide an etching mask for the substrate.

One particularly difficult set of problems in the industry concerns the ability to form small "pillars" and/or "holes" in substrate. As is known to those having ordinary skill in the art, a laundry list of difficulties is encountered when smaller and smaller diameter holes and pillars are desired. This is especially the case for, for example, holes having diameters of about 200 nm or less. Another process difficulty currently encountered is the relative inability to form two different size holes (pillars) in the same process layer. This results in the need for altering the design of the substrate or increasing the number of process steps required to achieve the desired surface conformation (reducing throughput).

Thus, what is needed is an improved lithography process capable of overcoming some of these problems. Thus, the present invention provides improved fabrication and patterning methods useful in chip fabrication processes as well as other microscale substrate fabrication processes.

SUMMARY OF THE INVENTION

To achieve the foregoing, the present invention provides a optical direct write lithography system and method capable of generating vortex phase shift optical exposure patterns that are directed onto a substrate to facilitate pattern transfer in an optical lithography process.

A method embodiment of the invention involves providing a substrate having formed thereon a photosensitive layer. A mirror array comprising a plurality of movable mirrors is configured in a desired vortex phase shift optical pattern. The mirror array is illuminated to form a resultant vortex phase shift exposure pattern associated with the vortex phase shift optical pattern of the mirror array. The exposure pattern is directed onto the photosensitive layer of the substrate where it exposes the photosensitive layer to facilitate pattern transfer to the photosensitive layer.

In another embodiment, the invention includes an optical direct write lithography system. The system includes a mirror array comprising a plurality of mirrors arranged in plurality of tiles configured in vortex phase shift optical patterns enabling the generation of a vortex phase shift exposure patterns. The system includes an illumination source for directing light onto the mirror array to produce phase shift exposure patterns. The system includes optics configured to project the phase shift exposure patterns onto a substrate and a stage for holding the substrate in the exposure pattern to facilitate pattern transfer onto the substrate.

In another apparatus embodiment, the invention comprises a mirror array for use in a maskless lithography system. The disclosed mirror array embodiment includes a plurality of mirrors arranged in a vortex phase shift optical pattern enabling the generation of a vortex phase shift exposure pattern when illuminated. Moreover, such an array features movable mirrors that can be reconfigured in accordance with the needs of a user.

These and other features and advantages of the present invention are described below with reference to the drawings.

BRIEF DESCRIPTION OF THE DRAWINGS

The following detailed description will be more readily understood in conjunction with the accompanying drawings, in which:

FIG. 1 is a simplified schematic diagram illustrating an optical direct write lithography system in accordance with the principles of the invention.

FIGS. 2A-2E are simplified diagrams that illustrate several possible mirror array configurations capable of producing vortex phase shift optical patterns in accord with some embodiments of the invention.

FIG. 3A is a simplified schematic depiction of a portion of a mirror array embodiment configured to generate an eight phase vortex phase shift exposure pattern in accordance with the principles of the invention.

FIG. 3B is a simplified schematic depiction of an illumination pattern produced by a vortex phase shift exposure pattern in accordance with the principles of the invention.

FIG. 3C is a simplified schematic depiction of a portion of another mirror array embodiment configured to generate an eight phase vortex phase shift exposure pattern in accordance with the principles of the invention.

FIGS. 4A and 4B are simplified schematic diagrams that illustrate example tile configuration embodiments capable of producing vortex phase shift optical patterns in accord with some embodiments of the invention.

FIG. 5 is a flow diagram illustrating operations in performing optical direct write vortex phase shift lithography processes to pattern a substrate in accordance with an embodiment of the present invention.

It is to be understood that in the drawings like reference numerals designate like structural elements. Also, it is understood that the depictions in the Figures are not necessarily to scale.

DETAILED DESCRIPTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

Implementations of the disclosed invention concern direct write optical lithography systems. Such systems are recently invented, for example being discussed in the previously referenced U.S. Utility patent application Ser. No. 10/825,342, filed 14 Apr. 2004. Also, implementations of direct write optical lithography systems are taught in the concurrently filed U.S. Utility patent application Ser. No. 10/993,603, entitled "Process and Apparatus for Generating a Strong Phase Shift Optical Pattern for Use in an Optical Direct Write Lithography Process", which application is incorporated herein by reference in its entirety for all purposes. In one example, the use of piston and tilted mirrors is described in "Optical Analysis of Mirror-Based Pattern Generation" by Y. Shroff, Yijian Chen, and W. G. Oldham; Proceedings of SPIE, Vol. 5037 (2003), the entire disclosure of which is incorporated herein by reference for all purposes. As a further example, integrated circuits comprising microelectronic mirror devices are available commercially. For example, Texas instruments, Inc. of Dallas, Tex. produces a Digital Micromirror Device (DMD) comprising an array of microscopically small square mirrors, each mirror corresponding to a pixel in the projected image. The individual micromirrors are vertically displaced (i.e., the mirrors are configured to be raised and lowered while their reflective surfaces remain substantially co-planar). Additionally, such mirrors can be configured so that the mirrors are all substantially co planar.

Such systems use programmable optical mirrors in a maskless lithography system to form desired phase shift optical patterns on a substrate. Such maskless direct-write lithography systems use an array of mirrors configured to operate in phase shift mode to generate a desired lithography pattern which is projected onto a substrate. The apparatus uses the mirror array to reflect light onto a photosensitive layer (for example, a photoresist layer) of a target substrate (e.g., a wafer or other substrate (for example, a reticle)) to achieve pattern transfer.

In the following detailed description, fabrication methods and apparatus for implementing direct write optical lithography systems to generate vortex phase shift exposure patterns is set forth. Such systems employ mirror arrays configured to generate vortex phase shift image patterns. These image patterns are projected onto a desired surface to achieve pattern transfer to fabricate surface patterns on the affected substrate.

As a general principle, the embodiments of the invention include a mirror array configured in a vortex phase shift optical pattern that can generate vortex phase shift exposure patterns when illuminated. The vortex phase shift exposure patterns are projected onto a substrate to be patterned. Typically, this means a substrate having a photosensitive layer formed thereon. When the photosensitive layer is exposed to the vortex phase shift exposure pattern it becomes photolithographically patterned. The patterned layer is then developed and then treated by further processes to for surface structures of a desired type on the substrate.

In accordance with embodiments of the invention, a lithography system illuminates a vortex phase shift mirror array to generate a desired vortex phase shift exposure pattern (or image pattern) which is directed onto a substrate. In such an embodiment a light source is directed onto a mirror array configured as vortex phase shift optical pattern to generate a spiraling diffraction pattern that forms a desired set of (constructive and destructive) interference patterns which are selectively de-magnified and projected onto a substrate. In general, the above described interference patterns generate a pattern of dark and light regions that can be use to photo define patterns on a substrate. In one embodiment, the vortex phase shift exposure pattern generates a pattern of dark spots can be used to define a pattern of openings (holes) or alternatively define a pattern of pillars in a layer of photosensitive material. This, as is known to those having ordinary skill in the art, can be controlled by the nature of the photosensitive material used to pattern the substrate. For example, a positive or negative photoresist can be chosen. Commonly, the substrate (e.g., a wafer or other substrate (for example, a reticle)) is covered with a layer of photosensitive material (for example, a photoresist material or other photoimageable material) which is exposed using the image pattern produced. Subsequently, the photosensitive material is developed and selectively washed away to define a desired pattern in the photosensitive layer. This patterned layer can then be used to transfer patterns onto the substrate.

FIG. 1 is a simplified schematic diagram illustrating one embodiment of an optical direct write system configured in accordance with an embodiment of the present invention. The system 100 uses an illumination source 108 to generate an off-axis light beam 109 that is projected onto a mirror array 102. In one implementation the source 108 includes an aperture 108a. Thus, light generated by the source 108 passes through an aperture 108a which generates off-axis light beams 109 that are directed into a beamsplitter 110 and through an optical system 112. After passing through optical system 112, the off-axis light beams 109 are directed onto a mirror array 102. The mirror array 102 is configured to generate controlled phase differences in the light from the off-axis light beams 109. Light reflected by the mirror array 102 is passed through the optical system 112 and beamsplitters 110, 114 and directed onto target wafer 104.

The illumination source 108 may be any illumination source capable of generating electromagnetic waves sufficient to reflect from the mirror array 102 and to induce chemical changes in a photosensitive layer on the wafer 104. Preferably the illumination source 108 is an intermittent source, capable of exposing the wafer during selected periods of a continuous scan movement of the light beam relative to the wafer. Commonly (but not exclusively), the illumination source 108 is a coherent light source. In one embodiment the illumination source 108 is an ArF excimer laser producing 193 nm (nanometer) output. Alternative sources, include but are not limited to, 157 nm and 248 nm sources as well as narrowly filtered light beams (such as an I-line light beam) can be used. The optical system 112 is typically a demagnifying projection optical system of a type known to those having ordinary skill in the art. However, many types of optical systems can be implemented. Moreover, the inventors contemplate systems without such optics.

The off axis light 109 from the source 108 is directed onto a mirror array 102 and projected onto the target substrate (here target wafer 104) using, for example, beamsplitters 110, 114 and projection optical system 112. As is known to those of ordinary skill many other arrangements are possible and can facilitate projecting a desired light pattern onto the substrate in accordance with the principles of the invention. In particular, in one alternative configuration the projection optical system 112 can be arranged between a beamsplitting optic 114 and the wafer 104. Additionally, it is especially pointed out that arrangements having fewer or no beamsplitters can be used.

In general, the system 100 uses a programmable mirror array 102 to modulate the light flux from the illumination source 108. Generally, this means configuring the mirror array 102 to generate a vortex phase shift exposure pattern (to be discussed in greater detail below) that is projected onto a substrate 104. The illumination source 108 generates an optical beam 109 that is passed through a projection optical system (e.g., optics 110, 114, 112) onto the substrate 104. In particular, the beam 109 is directed onto a programmable mirror array 102 configured in vortex phase shift optical pattern for generating a vortex phase shift exposure pattern in the light reflected by the mirror array 102. This light can be de-magnified by focusing and demagnification optics 112. After passing through the focusing and demagnification optics 112 the vortex phase shift exposure pattern is directed (e.g., using beamsplitter 110 and reflector 114) onto the target substrate 104 which is mounted on a movable stage 106.

The mirror array 102 can be configured to generate a light diffraction pattern that includes light of differing phase and differing intensities. This is facilitated through the implementation of a plurality of movable mirrors that form part of the array 102 and are generally controlled using a control element 115. The mirror array 102 can be reconfigured to generate many different patterns in accordance with the needs of the user. For example, each of the mirrors can be programmably actuated using, for example, a mirror array control element 115. Such a control element 115 can use software to actuate the individual mirrors of the array 102 to produce a desired optical pattern which is then projected onto a target substrate (here wafer 104) to produce a desired image. As alluded to above, the light from the illumination source 108 may be directed along an optical path 109 and onto the photosensitive wafer 104 by any suitable means as known to those of skill in the relevant art. In accordance with one embodiment, the mirror array 102 comprises a plurality of mirrors, each of the plurality of mirrors having a very small size. For example, mirrors having sides on the order of about 81 (micron) can be used. The inventors specifically point out that other sizes of mirrors can be used. The light from these mirrors can be demagnified using the focusing and demagnification optics 112 to generate image patterns having a final pixel size of about 30 nm on a side at the image plane (e.g., on the photosensitive layer of the wafer 104). Such demagnification can be accomplished using lens elements of the demagnification optics. As previously indicated, these elements can schematically represent much more complicated lens structures.

Although the apparatus illustrated is a catioptropic configuration, the scope of the invention is not so limited. That is, any configuration which allows the use of mirror arrays to direct light to a substrate is expected to be suitable and thus within the scope of the invention. The array 102 typically comprises an array of small movable mirrors that can be raised and lowered (vertically displaced) or tilted (or both) to generate a reflected optical signal such that at the interfaces between mirror groups a phase difference in the reflected light can be introduced. Thus, magnitude of the physical displacement of the piston mirrors is associated with the phase of the reflected light. In one suitable implementation, the mirrors of the mirror array are formed as square reflective surface having dimensions of about 8 μm (micron) by 8 μm. The optics can effectively demagnify the dimensions of the mirrors down to any desired size. For example, in one embodiment, the mirrors are demagnified to a square of about 30 nm on a side. As is known to those of ordinary skill many configurations and arrangements can facilitate projecting a desired light pattern onto a substrate in accordance with the principles of the invention.

FIGS. 2A-2E depict a number of simplified schematic depictions of some suitable mirror array configurations capable of generating vortex phase shift optical patterns in accordance with the principles of the invention. In general, the mirrors of the array are arranged so that to provide a series of phase steps according to the needs of the user. For example, the number of degrees phase shift in a phase step is determined using the following relationship: "phase step"=360°/step increments. Thus, four (4) step increments can be used to produce four 90 degree phase steps. This concept will be illustrated in more detail in the following paragraphs.

For example, with respect to FIG. 2A, an embodiment of a three phase mirror array configuration 200 is depicted. In accordance with the equation above, the three phase mirror array configuration 200 comprises three increments such that the phase steps are 120 degrees (120°=360°/3). Accordingly, the mirror array 200 includes a plurality of mirrors arranged in mirror sets 201, 202, 203. Using an example where the mirrors are piston mirrors, the mirrors are displaced to effect phase differences. Accordingly, each mirror set includes a multiplicity of similarly displaced mirrors. For example, in the depicted embodiment a first mirror set 201 can be treated as having zero displacement. The second mirror set can be displaced downward relative to, for example, the first mirror set 201. This downward displacement is such that a reflected optical signal from second mirror set 202 is about 120 degrees out of phase (i.e., −120 degrees out of phase) from a reflected optical signal reflected from the first mirror set 201. Additionally, the third mirror set 203 is further displaced so that the reflected optical signal from third mirror set 203 is about 120 degrees out of phase from a reflected optical signal reflected from the second mirror set 202 and also about 240 degrees out of phase from a reflected optical signal reflected from the first mirror set 201. Thus, in this depiction, the first mirror set 201 can also be to referred to as having zero phase. Also, the second mirror set 202 can be to referred to as having 120 degrees phase (e.g., relative to the first set of mirrors 201). In the same vein, the third mirror set 203 can be to referred to as having 240 degrees phase (e.g., relative to the first set of mirrors 201). Similar patterns are illustrated for FIGS. 2B-2E. Although described with respect to a piston mirror implementation, other embodiments using, for example, tilting mirrors or a combination of tilting and piston mirrors can be employed.

FIG. 2B depicts an embodiment of a four phase mirror array configuration 210. The mirror array 210 includes a plurality of mirrors arranged in mirror sets 211, 212, 213, 214. Again, each mirror set including a multiplicity of similarly displaced mirrors. For example, in the depicted embodiment a first mirror set 201 can be treated as having zero displacement. The second mirror 212 set can be displaced relative to, for example, the first mirror set 211. This displacement is such that a reflected optical signal from second mirror set 212 is about 90 degrees out of phase from a reflected optical signal reflected from the first mirror set 211. Additionally, the third mirror set 213 is further displaced so that the reflected optical signal from third mirror set 213 is about 90 degrees out of phase from a reflected optical signal reflected from the second mirror set 212 and also about 180 degrees out of phase from a reflected optical signal reflected from the first mirror set 211. Additionally, the fourth mirror set 214 is further displaced so that the reflected optical signal from fourth mirror set 214 is about 90 degrees out of phase from the third mirror set 213 and also about 180 degrees out of phase from the second mirror set 212. And additionally, the fourth mirror set 214 is displaced so that it is about 270 degrees (or positive 90 degrees) out of phase from the first mirror set 211.

FIG. 2C depicts a similar embodiment of a six phase mirror array configuration 220. The mirror array 220 includes a plurality of mirrors arranged in mirror sets 221, 222, 223, 224, 225, 226. Again, each mirror set including a multiplicity of similarly displaced mirrors. As before, the first mirror set 211 can operate as the baseline having "zero phase". The second mirror set 222 can be displaced relative to the first mirror set 221 about 60 degrees. This displacement is such that a reflected optical signal from second mirror set 222 is about 60 degrees out of phase from a reflected optical signal reflected from the first mirror set 221. Additionally, the third, fourth, fifth, and sixth mirror sets (223, 224, 225, 226 respectively) are progressively displaced a further sixty degrees each. So, for example, the reflected optical signal from fifth mirror set 225 is about 180 degrees out of phase from a reflected optical signal reflected from the second mirror set 222 and also about 240 degrees out of phase (or 120 degrees out in the opposite direction) from a reflected optical signal reflected from the first mirror set 221.

FIG. 2D depicts a similar embodiment of an eight phase mirror array configuration 230. The mirror array 230 includes a plurality of mirrors arranged in mirror sets a, b, c, d, e, f, g and h. Again, each mirror set including a multiplicity of similarly displaced mirrors. As before, the first mirror set a can operate as the baseline having "zero phase". The second mirror set b can be displaced relative to the first mirror set a about 45 degrees. As before, this displacement is such that a reflected optical signal from second mirror set b is about 45 degrees out of phase from a reflected optical signal reflected from the first mirror set a. Additionally, the third through eighth (c, d, e, f, g and h respectively) are progressively displaced a further forty-five degrees each. So, for example, the reflected optical signal from fifth mirror set e is about 135 degrees out of phase from a reflected optical signal reflected from the second mirror set b and also about 180 degrees out of phase from a reflected optical signal reflected from the first mirror set al.

FIG. 2E depicts a similar embodiment of a twelve phase mirror array configuration 240. The mirror array 240 includes a plurality of mirrors arranged in mirror sets in much the same manner as with the forgoing examples. Again, each mirror set includes a multiplicity of similarly displaced mirrors. As before, the first mirror set 241 can operate as the baseline having "zero phase". The second mirror set 242 can be displaced relative to the first mirror set 241 about 30 degrees (negative 30 degrees). As before, this displacement is such that a reflected optical signal from second mirror set 242 is about 30 degrees out of phase from a reflected optical signal reflected from the first mirror set 241. Additionally, the other mirror sets are each progressively displaced a further 30 degrees each. So, for example, the reflected optical signal from fifth mirror set 245 is about 90 degrees out of phase from a reflected optical signal reflected from the second mirror set 242 and also about 120 degrees out of phase (or alternatively, positive 240 degrees out of phase) from a reflected optical signal reflected from the first mirror set 241.

In some embodiments the area of each mirror set is configured to be same as the area of the other mirror sets. In other embodiments, the area need not be the same.

FIGS. 3A-3B illustrate various embodiments and implementations of mirror array arrangements. Each mirror array includes a plurality of movable mirrors. These mirrors can be configured as piston mirrors, tilt mirrors, or a combination of tilt and piston operation. Additionally, tilt mirrors can be of two different types. A mirror tilting about an edge (so it tilts like a door) is in a "cantilevered" mode of operation. A mirror tilting about a center axis is in a "torsional" mode of operation. Also, such tilt mirrors can be enhanced by including a quarter waveplate that is optically transmissive at the exposure wavelength over a portion of the mirror surface.

The following discussion uses a simplified example comprising a simplified piston mirror implementation. However, the reader is reminded that the embodiments discussed above can also be employed. In continuation, such piston mirrors can be positionally displaced while maintaining the reflective face of the mirror substantially parallel with the plane of the mirror array. In FIG. 3A a portion of an eight-phase mirror array 300 is depicted. This array 300 is configured as a plurality (four) of eight-phase tiles (four tiles 301, 302, 303, and 304 are depicted here) arranged adjacent to each other. The mirrors are arranged in mirror sets (e.g., a, b, c, d, e, f & g) that can be grouped together in tiles. FIG. 3A depicts a portion of an array illustrating four tiles which are depicted by the darkly outlined regions 301, 302, 303, 304. Each tile includes a plurality of mirror sets (i.e., a, b, c, d, e, f & g). Each mirror set comprises a multiplicity of mirrors being displaced to the same degree as the other mirrors in the set. The mirror sets are vertically displaced relative to other adjacent mirror sets. For example, mirror set d is vertically displaced relative to adjacent mirror sets c and e. In the eight-phase configuration depicted in FIG. 3A a multiplicity of mirrors are associated with the mirror set a. In the depicted example, the first mirror set a has a baseline (zero phase) displacement (e.g., no displacement). The second mirror set b has a displacement that corresponds to a 45 degree phase change in the reflected signal relative to the zero phase signal. Additionally, for each mirror set in a tile (e.g., 301) an incremental 45 degree phase change is made by displacing each mirror set a further 45 degrees from the preceding mirror set. This can proceed, for example, clock-wise until the first mirror set a is again reached. This process is repeated for each tile. Each tile may be configured having the same pattern of tile sets. However, different tile patterns can also be implemented. For example, it should be observed that each of the depicted tiles (301, 302, 303, and 304) of FIG. 3A have different displacement patterns. Moreover, many additional and different patterns can also be used. Generally, the mirror sets are arranged in a spiral configuration arranged about an axis or center point of the tile.

In some embodiments, the spiral mirror configuration of one tile can be merely rotated and/or reflected (i.e., a mirror image pattern) relative to another tile. Using FIG. 3A as an example, tile 302 has a reflected (about axis 320) configuration relative to tile 301. Also, tile 304 has a reflected (about another axis 330) configuration relative to tile 301. Also, 302 and 304 are reflected relative to tile 303. The inventors point out that the mirror groups of the adjacent tiles are in phase with each other in this embodiment. For example, it is noted that group f of tile 302 is adjacent to group f of tile 303. This alignment of phase between tiles reduces the amount of interference between tiles.

FIG. 3B is a simplified schematic diagram of a light intensity map of the phase shift exposure pattern generated by the phase shift optical pattern of the mirror array of FIG. 3A. The depicted tile patterns (as shown in FIG. 3A) are associated with regions of extreme darkness. For example, FIG. 3B shows one example phase shift exposure pattern generated by the tiles depicted in FIG. 3A. Each tile is configured to generate a dark region. For example, an exposure pattern generated by tile 301 is schematically depicted. A darkest region 301' is shown. A slightly more light region 311 is around the dark region 301'. A still lighter region 312 surrounds region 311. A region 315 of still higher relative light intensity is also shown. Thus, the tiles can be configured to generate a pattern of dark spots that can be used to pattern a photosensitive layer (e.g., a photoresist) formed on a substrate (for example a semiconductor wafer or glass plate). Depending on the nature of the photosensitive material, a pattern of holes or pillars can be formed using the mirror array.

Mirror array arrangements of the type discussed herein allow greater flexibility in pattern formation. For example, different tile configurations can generate different size dark spots and thereby allow the formation of different size holes/pillars using the same process step. For example, in one embodiment an eight-phase tile can be used to generate a smaller dark spot than a four-phase tile. Additionally, such vortex phase shift patterns increase the process window. In other words, greater image fidelity can be obtained despite variation in focus and exposure dosage. Additionally, image placement errors can be reduced using vortex phase shift mirror arrangements.

FIG. 3C depicts another example embodiment where the spiral mirror configuration of one tile is rotated relative to other adjacent tiles. For example, none of the depicted tiles are reflected. Instead, tile 312 is rotated 180° relative to tile 311. Moreover, tile 314 is rotated 180° relative to tile 311. The same can be said of tile 313 which is rotated 180° relative to adjacent tiles 312 and 314. FIG. 3A has the minimum phase interference between regions 301, 302, 303, and 304. It is noted that in FIG. 3C the phase difference at the tile interface is not always zero. This changes the illumination dose required to print features and thereby alters the critical dimensions possible. The inventors note that other combinations of rotation and reflection are possible such tile patterns generally have greater phase differences at the tile interfaces. Accordingly, these configurations change the illumination dose required to print features and thereby alters the critical dimensions possible. The inventors contemplate that other embodiments that utilize combinations of tile rotation and reflection can be used to arrange the adjacent tiles so that phase differences at the tile interfaces of about 135° or less are generated. Such phase interference is suitable for use with the present invention. However, the inventors contemplate that embodiments having phase differences at the tile interfaces of about 120° are preferred for use with the present invention.

FIGS. 4A and 4B illustrate two of many possible tile arrangements used with a mirror array in accordance with the principles of the invention. FIG. 4A depicts one embodiment of a four-phase tile arrangement. The depicted first mirror set 401 is arranged (in this embodiment) having no displacement (and thus in this implementation zero phase). The second mirror set 402 includes a multiplicity of mirrors (i.e., in this example, 36 mirrors) that are displaced relative to the first mirrors 401. The displacement is such that a 90 degree phase difference is introduced between the first mirror set 401 and the second mirror set. The mirrors of the third mirror set 403 are displaced 90 degrees relative to the second mirror set 402 and 180 degrees relative to the first mirror set 401. Finally, the fourth mirror set 404 is displaced 90 degrees relative to the third mirror set 403, 180 degrees relative to the second mirror set 402, an 270 degrees relative to the first mirror set 401. It is noted that the surface area of each of the mirror sets (401, 404, 404, 404) of the tile 400 is the same. For example, each depicted mirror set comprises six mirrors by six mirrors with each mirror demagnified to about 30 nm×30 nm. Thus, the total size of the projected tile is about 360 nm×360 nm. Although the surface areas for the depicted mirror sets are equal, this need not be the case.

FIG. 4B depicts an embodiment of a tile 410 where the mirror sets do not have equal surface area. The depicted tile 410 illustrates one embodiment of a twelve-phase tile. A first mirror set 411 is arranged having, for example, no displacement (associated with zero phase). The second mirror set 412 includes a multiplicity of mirrors that are displaced relative to the first mirror set 411. In this embodiment, the displacement introduces a 30 degree phase difference between the light reflected by the first mirror set 411 and the light reflected by the second mirror set 412. The third mirror set 413 is displaced a further 30 degrees relative to the second mirror set 412 and 60 degrees relative to the first mirror set 411. It should be noted that the surface area of the third set is considerable less than the area of the second mirror set 412 (i.e., six mirrors to 15 mirrors). In like manner, the fourth mirror set 414 is displaced a further 30 degrees relative to the third mirror set 413. Thus, the fourth mirror set 414 is displaced 60 degrees relative to the second mirror set 412 and 90 degrees relative to the first mirror set 411. This displacement proceeds in a continually increasing manner as each of the other mirror sets (415-422) are displaced.

Additionally, the inventors point out that by reducing the number of mirrors in each mirror set involved with forming the vortex phase shift pattern, the CD of the resulting hole or pillar can be changed. For example, referring to FIG. 4B, reducing sets 411, 412, 414, 415, 417, 418, 420, and 421 from 15 vortex phase shifting mirrors to 14 or some smaller number of mirrors will result in reducing the strength of the vortex phase interference and therefore increasing the printed CD.

FIG. 5 is a flow diagram illustrating operations for performing optical lithography using a vortex phase shift optical direct write process. In one method embodiment, a method of forming an image pattern on a photosensitive layer of a substrate is taught. The flow diagram 500 includes an operation of providing a substrate (Step 501). Typically the substrate shall include a photosensitive layer onto which image patterns can be transferred. Such photosensitive materials comprise photoimageable materials such as photoresists and other related materials. A mirror array comprising a plurality of movable mirrors is provided (Step 503). The mirrors of the array are then configured into a mirror arrangement capable of producing a desired vortex phase shift optical pattern in the mirror array when the mirrors are illuminated (Step 505). An image pattern is then formed by illuminating the mirror array (Step 507) to form a resultant vortex phase shift exposure pattern associated with the desired vortex phase shift optical pattern in the mirror array. In general, an optical beam is projected onto a properly configured mirror array to form a desired vortex phase shift exposure pattern. In one implementation, the created image pattern is directed along an optical path to onto the photosensitive layer of the substrate (Step 509) to expose the photosensitive layer of the substrate with the resultant vortex phase shift exposure pattern to facilitate pattern transfer to the photosensitive layer (Step 511). Many other lithography techniques known to those having ordinary skill in the art can be implemented to accomplish pattern transfer in accordance with the principles of the invention.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A mirror array for use in a maskless lithography system, the mirror array comprising:
a plurality of mirrors arranged in a vortex phase shift optical pattern enabling the generation of a vortex phase shift exposure pattern when illuminated.

2. The mirror array of claim 1 wherein the plurality of mirrors are arranged as a plurality of tiles wherein each tile comprises a multiplicity of mirror sets arranged in a vortex phase shift optical pattern enabling the generation of a vortex phase shift exposure pattern when illuminated.

3. The mirror array of claim 2 wherein the mirror sets of each tile are arranged in a spiral configuration wherein the mirrors of each mirror set are vertically displaced relative to the mirrors of an adjacent mirror set.

4. The mirror array of claim 3 wherein the amount of displacement between the mirrors of the mirror sets is associated with a phase difference in light reflected by the mirrors.

5. The mirror array of claim 4 wherein the mirror sets are configured in a spiral pattern arranged about a center point of the tile to form the vortex phase shift optical pattern for each tile.

6. The mirror array of claim 4 wherein the tile comprises three mirror sets arranged in a spiral pattern about an axis such that the amount of displacement between the mirrors of a mirror set is associated with an about 120 degree phase difference in light reflected by an adjacent mirror set of the tile.

7. The mirror array of claim 4 wherein the tile comprises four mirror sets arranged in a spiral pattern about an axis such that the amount of displacement between the mirrors of a mirror set is associated with an about 90 degree phase difference in light reflected by an adjacent mirror set of the tile.

8. The mirror array of claim 4 wherein the tile comprises six mirror sets arranged in a spiral pattern about an axis such that the amount of displacement between the mirrors of a mirror set is associated with an about 60 degree phase difference in light reflected by an adjacent mirror set of the tile.

9. The mirror array of claim 4 wherein the tile comprises eight mirror sets arranged in a spiral pattern about an axis such that the amount of displacement between the mirrors of a mirror set is associated with an about 45 degree phase difference in light reflected by an adjacent mirror set of the tile.

10. The mirror array of claim 4 wherein the tile comprises twelve mirror sets arranged in a spiral pattern about an axis such that the amount of displacement between the mirrors of a mirror set is associated with an about 30 degree phase difference in light reflected by an adjacent mirror set of the tile.

11. The mirror array of claim 4 wherein the tile comprises n mirror sets arranged in a spiral pattern about an axis such that the amount of displacement between the mirrors of a mirror set is associated with an about 360/n degree phase difference in light reflected by an adjacent mirror set of the tile.

12. The mirror array of claim 5 wherein the spiral pattern of the mirror sets formed on each of the tiles, comprise the same pattern for each of the tiles.

13. The mirror array of claim 5 wherein the spiral pattern of the mirror sets for a portion of the tiles is different than the spiral pattern of the mirror sets for another portion of the tiles.

14. The mirror array of claim 5 wherein the arrangement of mirror sets for a first spiral pattern of mirror sets of a first tile is different from an arrangement of mirror sets for a second spiral pattern of mirror sets for a second adjacent tile.

15. The mirror array of claim 14 wherein the second spiral pattern of mirror sets for the second tile is rotated relative to the first spiral pattern of mirror sets for first tile.

16. The mirror array of claim 14 wherein the second spiral pattern of mirror sets for the second tile is a mirror image reflection of the first spiral pattern of mirror sets for first tile.

17. The mirror array of claim 14 wherein the second spiral pattern of mirror sets for the second tile is rotated relative to the first spiral pattern of mirror sets for first tile and is also reflected about an axis relative to the first spiral pattern of mirror sets for first tile.

18. The mirror array of claim 1 wherein the plurality of mirrors comprise a plurality of movable mirrors that can be controllably displaced from an original position in order to generate the vortex phase shift optical patterns.

19. The mirror array of claim 2 wherein the plurality of mirrors arranged as the plurality of tiles comprise movable mirrors that can be controllably displaced from an original position in order to generate the vortex phase shift optical patterns for the tiles.

20. The mirror array of claim 2 wherein the mirror sets of each tile are arranged in a spiral configuration and wherein each of the mirrors of a mirror set are tilted at the same angle but are tilted at a different angle from the mirrors of other adjacent mirror sets of the tile such that they generate phase interference at an interface between two adjacent mirror sets of the tile.

21. The mirror array of claim 20 wherein the mirrors of each tile are cantilevered mirrors arranged to tilt about a mirror edge.

22. The mirror array of claim 20 wherein the mirrors of each tile are tilted about a central axis.

23. The mirror array of claim 20 wherein each of the mirrors of each tile include quarter wavelength waveplates that are optically transparent at an exposure wavelength used to illuminate the mirror array.

24. The mirror array of claim 1 wherein the vortex phase shift optical pattern comprises a spiraling diffraction pattern.

25. The mirror array of claim 1 wherein the vortex phase shift exposure pattern comprises at least one substantially circular dark region.

26. The mirror array of claim 1 wherein the vortex phase shift exposure pattern comprises a plurality of substantially concentric and substantially circular regions of differing light intensity.

* * * * *